US008610216B2

(12) United States Patent
Galy et al.

(10) Patent No.: US 8,610,216 B2
(45) Date of Patent: Dec. 17, 2013

(54) STRUCTURE FOR PROTECTING AN INTEGRATED CIRCUIT AGAINST ELECTROSTATIC DISCHARGES

(75) Inventors: Philippe Galy, Le Touvet (FR); Christophe Entringer, Brignoud (FR); Jean Jimenez, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 459 days.

(21) Appl. No.: 12/859,929

(22) Filed: Aug. 20, 2010

(65) Prior Publication Data

US 2011/0042747 A1    Feb. 24, 2011

(30) Foreign Application Priority Data

Aug. 24, 2009    (FR) ...................................... 09 55757

(51) Int. Cl.
*H01L 23/62*    (2006.01)

(52) U.S. Cl.
USPC ..................... 257/360; 257/355; 257/E27.072

(58) Field of Classification Search
USPC ......... 257/355, 360, 256, 257, 107, 546, 547, 257/E29.255; 361/56; 327/310, 428
See application file for complete search history.

(56) References Cited

U.S. PATENT DOCUMENTS 5,473,169 A * 12/1995 Ker et al. ....................... 257/173
5,895,940 A    4/1999 Kim
5,920,096 A *  7/1999 Lee ................................. 257/355
5,962,902 A * 10/1999 Kato et al. ..................... 257/372
6,960,792 B1 * 11/2005 Nguyen ......................... 257/173
2004/0070901 A1    4/2004 Umeda
2006/0151836 A1*  7/2006 Salcedo et al. ................ 257/362

FOREIGN PATENT DOCUMENTS

WO    WO 9403928 A1    2/1994

OTHER PUBLICATIONS

French Search Report dated Mar. 17, 2010 from corresponding French Application No. 09/55757.

* cited by examiner

*Primary Examiner* — Wael Fahmy
*Assistant Examiner* — Sarah Salerno
(74) *Attorney, Agent, or Firm* — Wolf, Greenfield & Sacks, P.C.

(57) ABSTRACT

A structure for protecting an integrated circuit against electrostatic discharges, including a device for removing overvoltages between first and second power supply rails; and a protection cell connected to a pad of the circuit including a diode having an electrode, connected to a region of a first conductivity type, connected to the second power supply rail and having an electrode, connected to a region of a second conductivity type, connected to the pad and, in parallel with the diode, a thyristor having an electrode, connected to a region of the first conductivity type, connected to the pad and having a gate, connected to a region of the second conductivity type, connected to the first rail, the first and second conductivity types being such that, in normal operation, when the circuit is powered, the diode is non-conductive.

24 Claims, 3 Drawing Sheets

STRUCTURE FOR PROTECTING AN INTEGRATED CIRCUIT AGAINST ELECTROSTATIC DISCHARGES

CROSS REFERENCE TO RELATED APPLICATIONS

This application claims the priority benefit of French patent application number 09/55757, filed on Aug. 24, 2009, entitled "STRUCTURE FOR PROTECTING AN INTEGRATED CIRCUIT AGAINST ELECTROSTATIC DISCHARGES" which is hereby incorporated by reference to the maximum extent allowable by law.

BACKGROUND OF THE INVENTION

1. Field of the Invention

The present invention relates to structures for protecting integrated circuits against electrostatic discharges.

2. Discussion of the Related Art

FIG. 1 is a simplified top view of an integrated circuit chip. The integrated circuit comprises a central portion 1 connected to an assembly of metal pads 3 arranged at the chip periphery and intended to provide connections to the outside. Central portion 1 comprises all the components enabling the integrated circuit to perform desired functions. Some of pads 3 are intended to receive positive ($V_{DD}$) and negative ($V_{SS}$) supply voltages. Positive and negative supply rails 5 and 7 are generally provided all around the circuit. The other pads 3 are especially intended for receiving and/or for providing input-output signals. The entire circuit is covered with an insulating layer which only leaves access to terminals connected to pads 3, and may be placed in a package comprising lugs connected to pads 3 or balls connected to these pads.

Such a circuit generally receives and/or provides signals of low voltage level (for example, from 0.6 to 3 V) and low current intensity (for example, from 1 µA to 10 mA), and is likely to be damaged in the occurrence of overvoltages or overcurrents between terminals of the package. Overvoltages may occur during the manufacturing or assembly phase, before the circuit is assembled in a device (for example, on a printed circuit board), in the occurrence of electrostatic discharges linked to the manipulation of the circuits by tools or by hand. Such overvoltages may reach several thousands of volts and destroy elements of the circuit.

It is thus provided to associate, with each pad 3, a protection structure which generally takes up a ring 9 arranged between pads 3 and central portion 1 of the chip. The protection structure should be capable of rapidly draining off large currents, which may appear when an electrostatic discharge occurs between two pads or two terminals of the package, and in case of an overvoltage on a terminal of a device connected to a circuit.

FIG. 2 shows the electric diagram of an example of a protection structure 10, associated with an input-output pad 3 of an integrated circuit. A block 11 connected to pad 3 and to positive and negative power supply rails 5 and 7 symbolizes circuit elements protected by structure 10 against possible electrostatic discharges.

A diode 12 is forward-connected between pad 3 and positive supply rail 5. A diode 13 is reverse-connected between pad 3 and negative supply rail 7. A MOS transistor 15, used as a switch, is connected between rails 5 and 7. An overvoltage detection circuit 17, connected in parallel on MOS transistor 15, provides this transistor with a trigger signal. Overvoltage detection circuit 17 may, for example, be an edge detector comprising a resistor in series with a capacitor, the connection node between the resistor and the capacitor switching state in the occurrence of an abrupt overvoltage. MOS transistor 15 especially comprises a parasitic diode 16 forward-connected between rail 7 and rail 5.

The operation of protection structure 10 in case of an overvoltage occurring on an input-output pad (now simply called "pad") or on a pad connected to a power supply rail (now simply called "rail") will be disclosed hereafter.

In normal operation, when the chip is powered, that is, when rail 5 is positive with respect to rail 7 and the input-output pads are at an intermediary level, diodes 12 and 13 are both reverse-biased and conduct no current. Further, detection circuit 17 turns off MOS transistor 15.

In case of a positive overvoltage between positive and negative supply rails 5 and 7, circuit 17 turns on transistor 15, which removes the overvoltage.

In case of a negative overvoltage between rails 5 and 7, parasitic diode 16 of transistor 15 turns on and the overvoltage is removed.

In case of a positive overvoltage between a pad 3 and positive supply rail 5, diode 12 turns on and the overvoltage is removed.

In case of a negative overvoltage between a pad 3 and rail 5, circuit 17 turns on transistor 15, and the overvoltage is removed through transistor 15 and diode 13.

In case of a positive overvoltage between a pad 3 and negative supply rail 7, diode 12 turns on and the positive overvoltage is transferred onto rail 5, which corresponds to the above-discussed case of a positive overvoltage between rails 5 and 7.

In case of a negative overvoltage between a pad 3 and negative supply rail 7, diode 13 turns on and the overvoltage is removed.

In case of an overvoltage between two pads 3, diode 12 associated with most positive pads turn on, and the overvoltage is transferred to positive supply rail 5. This corresponds to the above-discussed case of a negative overvoltage between a pad 3 (the most negative pad) and rail 5.

A disadvantage of such a protection structure lies in the fact that diodes 12 and 13 have significant stray capacitances. In normal operation, the characteristics of the input/output signals of the circuit are degraded by such stray capacitances.

Further, to be able to drain off the currents induced by electrostatic discharges, diodes 12 and 13 should have a significant surface area (typically, a junction perimeter of 200 µm per diode). As a result, ring 9 (FIG. 1) takes up a significant silicon surface area, to the detriment of central portion 1 of the chip.

Further, diodes 12 and 13 are separate components, which makes the manufacturing of ring 9 more complex. The separate components should further be insulated from one another, which increases the total silicon surface area of an integrated circuit.

SUMMARY OF THE INVENTION

Thus, an object of an embodiment of the present invention is to provide a structure of protection against electrostatic discharges which overcomes all or part of the disadvantages of conventional protection structures.

An object of an embodiment of the present invention is to provide a structure of protection against electrostatic discharges of decreased stray capacitance.

An object of an embodiment of the present invention is to provide such a structure which takes up a small silicon surface area.

An object of an embodiment of the present invention is to provide such a structure which is easy to implement.

Thus, an embodiment of the present invention provides a structure for protecting an integrated circuit against electrostatic discharges, comprising a device for removing overvoltages between first and second power supply rails; and a protection cell connected to a pad of the circuit comprising a diode having an electrode, connected to a region of a first conductivity type, connected to the second power supply rail and having an electrode, connected to a region of a second conductivity type, connected to the pad and, in parallel with the diode, a thyristor having an electrode, connected to a region of the first conductivity type, connected to the pad and having a gate, connected to a region of the second conductivity type, connected to the first rail, the first and second conductivity types being such that, in normal operation, when the circuit is powered, the diode is non-conductive.

According to an embodiment of the present invention, the protection cell comprises first to fifth regions of alternated conductivity types having, in top view, the shape of concentric rings of increasing respective diameters, wherein the first to third regions are formed in a central well of the first conductivity type; the first region is of the second conductivity type; the fourth and fifth regions are formed in a peripheral well of the second conductivity type; and the first and fourth regions are connected to said pad, the second and third regions are connected to the second power supply rail, and the fifth region is connected to the first power supply rail.

According to an embodiment of the present invention, the first and second conductivity types respectively correspond to a P-type doping and to an N-type doping and, in normal operation, the first power supply rail is more positive than the second power supply rail.

According to an embodiment of the present invention, the first and second conductivity types respectively correspond to an N-type doping and to a P-type doping and, in normal operation, the second power supply rail is more positive than the first power supply rail.

According to an embodiment of the present invention, said regions are insulated from one another by silicon oxide regions.

According to an embodiment of the present invention, the device for removing overvoltages between first and second power supply rails comprises a MOS transistor having first and second conduction terminals respectively connected to the first and second power supply rails and, between the power supply rails, an overvoltage detector having its output controlling the MOS transistor.

According to an embodiment of the present invention, the overvoltage detector comprises a resistor in series with a capacitor, the connection node between the resistor and the capacitor being connected to the gate of the MOS transistor.

According to an embodiment of the present invention, said rings have square or rectangular contours.

According to an embodiment of the present invention, the first region has the shape of a filled ring.

According to an embodiment of the present invention, the first region has the shape of a ring with a hollowed central portion.

The foregoing objects, features, and advantages of the present invention will be discussed in detail in the following non-limiting description of specific embodiments in connection with the accompanying drawings.

DETAILED DESCRIPTION

Figure 1:
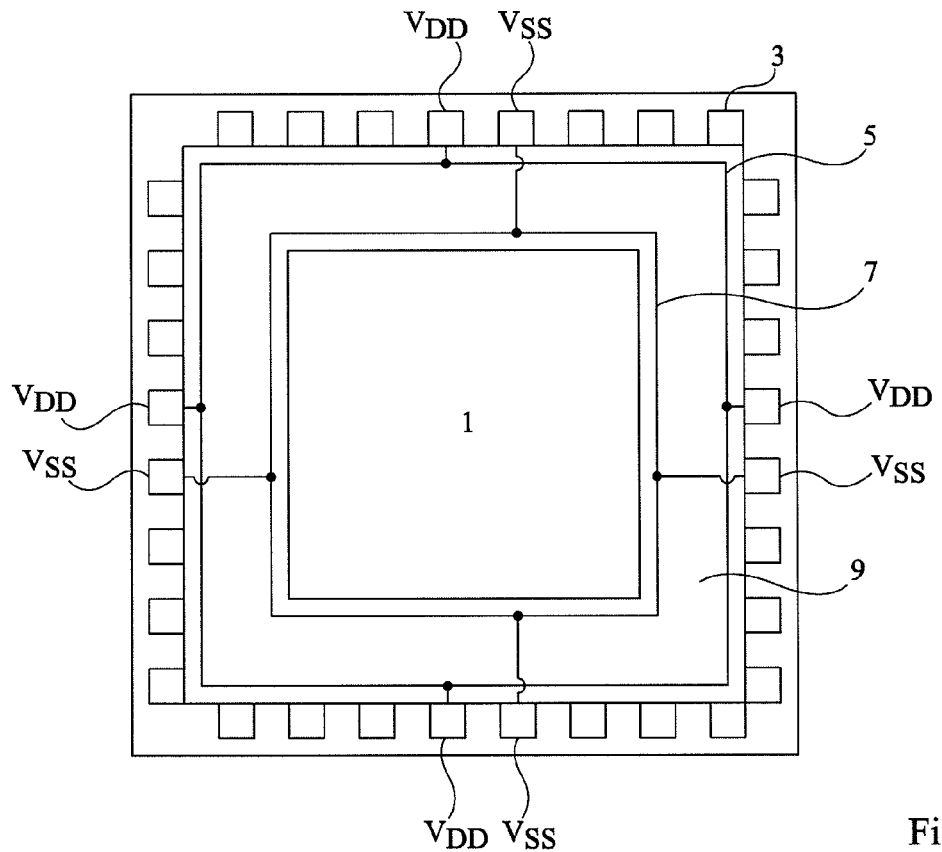
FIG. 1, previously described, is a simplified top view of an integrated circuit chip.

For clarity, the same elements have been designated with the same reference numerals in the different drawings and, further, as usual in the representation of integrated circuits, the various drawings are not to scale.

Figure 3:
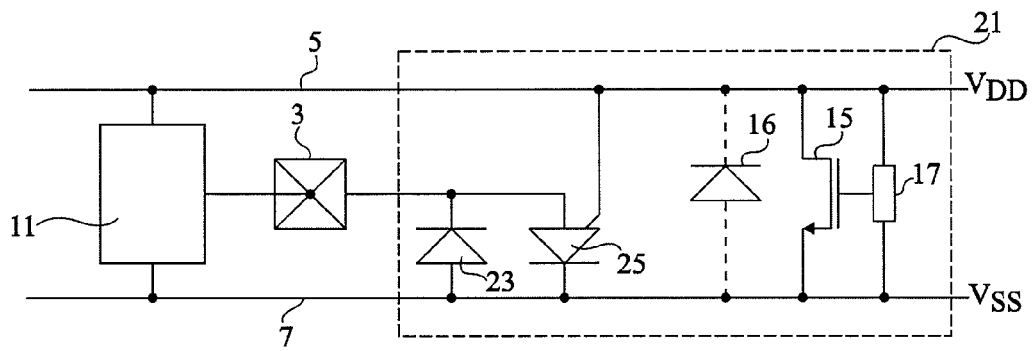
FIG. 3 shows the electric diagram of an embodiment of a structure of protection against overvoltages associated with an integrated circuit pad.

FIG. 3 shows the electric diagram of an example of a structure of protection against overvoltages 21, associated with an input/output pad 3 of an integrated circuit. A block 11 connected to pad 3 and to positive and negative power supply rails 5 and 7, symbolizes circuit elements protected by structure 21 against possible electrostatic discharges.

Figure 2:
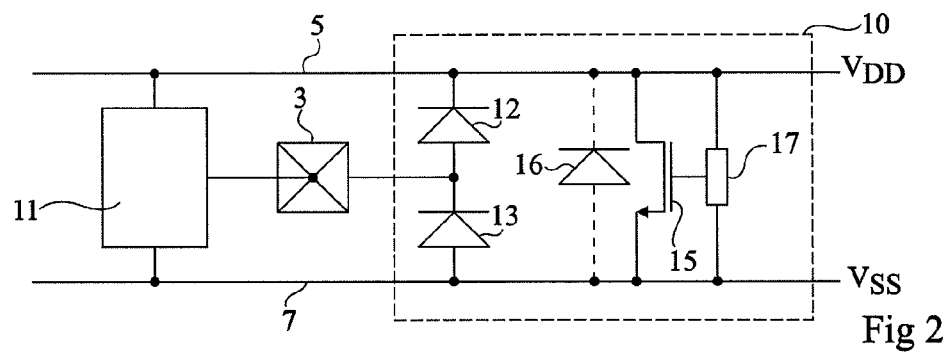
FIG. 2, previously described, shows the electric diagram of an example of a structure of protection against overvoltages associated with a pad of an integrated circuit.

Like protection structure 10 described in relation with FIG. 2, structure 21 comprises a MOS transistor 15, used as a switch, connected between rails 5 and 7. An overvoltage detection circuit 17, connected in parallel with MOS transistor 15, provides a trigger signal to this transistor. MOS transistor 15 especially comprises a parasitic diode 16 forward-connected between rail 7 and rail 5.

A diode 23 is reverse-connected between pad 3 and negative rail 7. A thyristor 25 is forward-connected between pad 3 and rail 7. The anode gate of thyristor 25 is connected to positive rail 5.

In normal operation, that is, when the chip is powered, the signals on pad 3 and rails 5 and 7 are such that diode 23 conducts no current and detection circuit 17 turns off MOS transistor 15. The anode gate of thyristor 25 is more positive than its anode and this thyristor thus remains off.

In case of a positive overvoltage between rails 5 and 7, circuit 17 turns on transistor 15, which removes the overvoltage.

In case of a negative overvoltage between rails 5 and 7, parasitic diode 16 of transistor 15 turns on and the overvoltage is removed.

In case of a positive overvoltage between a pad 3 and rail 5, a current flows between pad 3 and rail 5, through the anode and the anode gate of thyristors 25. This current turns on thyristor 25 and the overvoltage is removed through thyristor 25 and diode 16.

In case of a negative overvoltage between a pad 3 and rail 5, circuit 17 turns on transistor 15 and the overvoltage is removed through transistor 15 and diode 23.

In case of a positive overvoltage between a pad 3 and rail 7, the anode of thyristor 25 is positive with respect to its anode gate. Part of the overvoltage is thus transferred to rail 5 and circuit 17 turns on MOS transistor 15. There thus is a conduction path between pad 3 and rail 7, through the anode and the anode gate of thyristor 25 and through MOS transistor 15. This current turns on thyristor 25, which then removes the overvoltage.

In case of a negative overvoltage between a pad 3 and rail 7, diode 23 becomes conductive and removes the overvoltage.

In order to explain the removal of an overvoltage between two input/output pads, the pad receiving the highest voltage is called the positive pad and the pad receiving the lowest voltage is called the negative pad. In case of an overvoltage between pads, a current flows between the anode and the anode gate of thyristor 25 associated with the positive pad. Part of the overvoltage is thus transferred onto rail 5, and circuit 17 turns on MOS transistor 15. There thus is a conduction path between the positive pad and the negative pad, through the anode and the anode gate of thyristor 25 associated with the positive pad, through MOS transistor 15, and through diode 23 associated with the negative pad. This current turns on thyristor 25. The overvoltage is then removed through thyristor 25 associated with the positive pad and through diode 23 associated with the negative pad.

Protection structure 21 thus enables to remove all types of overvoltages likely to occur between pads and/or rails of the circuit following an electrostatic discharge.

An advantage of structure 21 lies in the fact that one of the two diodes of conventional protection structures is replaced with a thyristor. Now, for an equal current drain-off capacity, a thyristor exhibits a stray capacitance at least twice smaller than that of a diode. Protection structure 21 thus has a decreased stray capacitance with respect to the structure with two diodes of FIG. 2.

Further, for an equal current drain-off capacity, a thyristor will have a smaller surface area than a diode due to its smaller on-state voltage drop.

To further decrease the surface area of the protection structure, a specific integration mode of thyristor 25 and of diode 23 of a protection structure is provided.

Figure 4A:
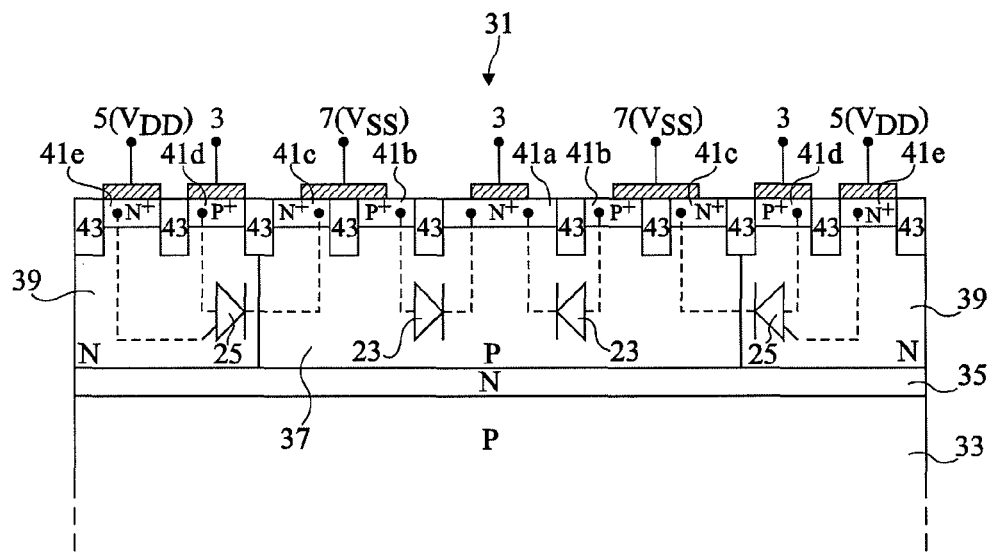
FIG. 4A is a cross-section view schematically showing an embodiment of a portion of the protection structure described in relation with FIG. 3.

FIG. 4A is a cross-section view schematically showing an embodiment of a protection cell 31 comprising thyristors 25 and diode 23 of protection structure 21 described in relation with FIG. 3.

Figure 4B:
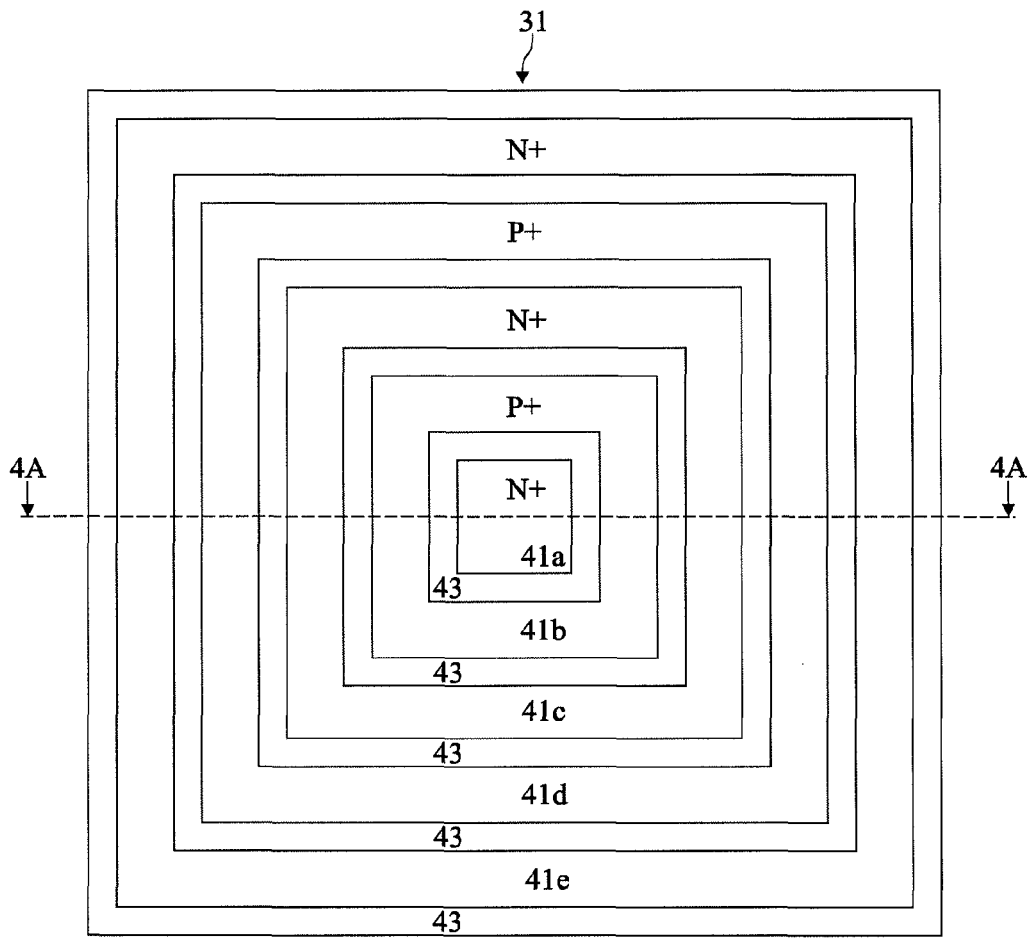
FIG. 4B is a top view of FIG. 4A.

FIG. 4B is a top view of FIG. 4A.

As an example, the context of CMOS technology is considered, which especially enables forming N-channel MOS transistors in P-type doped wells, and P-channel MOS transistors in N-type doped wells. The N and P wells are generally formed in an N-type layer 35, resting on a P-type doped substrate 33. As an example, the doping level of substrate 33 is on the order of from $10^{14}$ to $10^{15}$ atoms/cm$^3$, the doping level of layer 35 is on the order of $10^{18}$ atoms/cm$^3$, and the doping level of the N and P wells is on the order of from $10^{16}$ to $10^{17}$ atoms/cm$^3$.

A P-type doped central well 37 is formed in the upper portion of layer 35. Well 37 is surrounded with a peripheral N-type doped well 39, which extends from the periphery of the central well. In top view, well 39 has the shape of a ring with an inner contour in contact with the outer contour of central well 37.

In the upper portion of wells 37 and 39, five heavily-doped regions 41a to 41e of alternated conductivity types having the shape of concentric rings of increasing respective diameters in top view, that is, in a plane parallel to the main surfaces of the substrate. In the shown example, the rings have square contours, and the ring 41a of smaller diameter is a filled ring.

Rings 41a to 41c are formed in central well 37, and the ring of smaller diameter 41a is of the conductivity type opposite to that of well 37, that is, of type N in this example. Rings 41d and 41e are formed in peripheral well 39.

As an example, the doping level of N-type regions 41a, 41c, and 41e is on the order of from $10^{19}$ to $10^{21}$ atoms/cm$^3$, and the doping level of P-type regions 41b and 41d is on the order of from $10^{18}$ to $10^{20}$ atoms/cm$^3$, which corresponds, in CMOS technology, to the doping levels of the source and drain regions of MOS transistors.

In this example, regions 41a to 41e are insulated from one another by grooves 43 filled with silicon oxide (STI).

Region 41e is connected to positive power supply rail 5. Regions 41d and 41a are connected to an input/output pad 3 of the circuit. Regions 41c and 41b are connected to negative power supply rail 7. As an example, the above-mentioned connections comprise metallizations, shown in FIG. 4A by hatched areas, forming ohmic contacts with heavily-doped regions 41a to 41e.

As schematically illustrated in FIG. 4A, protection cell 31 forms, between pad 3 and power supply rails 5 and 7, a diode 23 and a thyristor 25, connected as described in relation with FIG. 3.

Thyristor 25, corresponding to PNPN regions 41d-39-37-41c, can be found between pad 3 and rail 7. The anode gate of this thyristor, corresponding to region 41e, is connected to rail 5. Diode 23, corresponding to N$^+$PP$^+$ regions 41b-37-41a, can be found between pad 3 and rail 7.

According to an advantage of the above-described embodiment, diode 23 and thyristor 25 are integrated in a single protection cell 31. Thus, the silicon surface area useful to remove overvoltages is optimized with respect to structures comprising two separate diodes (FIG. 2) to be insulated from each other. As an example, for an equivalent overvoltage removal ability, cell 31 takes up a surface area which is approximately six times smaller than that of the two diodes of a conventional structure.

According to another advantage of such an integration with concentric rings, the surface of the contact metallizations between diode 23 and thyristor 25 is small with respect to a protection structure comprising only discrete components. This limits the parasitic capacitance due to the protection. In particular, in the present cell, a single common contact metallization is provided for the anode of diode 23 and the cathode of thyristor 25. For example, in the known implementations, due to the parasitic capacitance associated with the protection structure, the frequency of the useful signal emitted or received on the pads of the protected circuit cannot be over 10 GHz. The tests made by the inventor have shown that the disclosed protection structure can be associated with circuits having pads emitting and/or receiving signals at frequencies close to 20 GHz.

Figure 5:
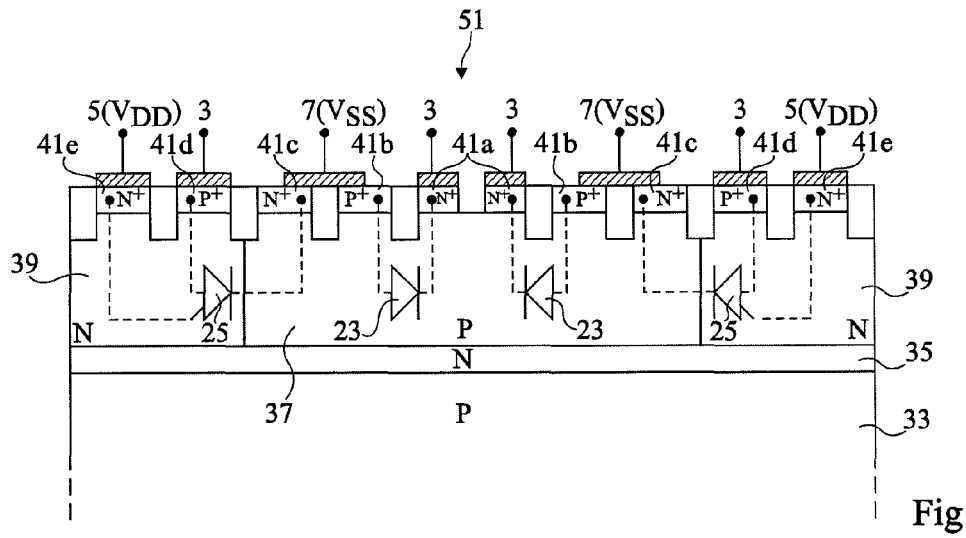
FIG. 5 is a cross-section view in the same plane as FIG. 4A, showing an alternative embodiment of a portion of the structure described in relation with FIG. 3.

FIG. 5 is a cross-section view in the same plane as FIG. 4A showing an alternative embodiment of a protection cell 51 comprising thyristor 25 and diode 23 of structure 21 described in relation with FIG. 3.

Protection cell 51 is identical to protection cell 31 described in relation with FIGS. 4A and 4B, but for the fact that heavily-doped region 41a, of smaller diameter, has in top view the shape of a ring with a hollowed central portion, and not of a filled ring, which decreases the stray capacitance of diode 23.

As an example, for an equivalent overvoltage removal ability, cell 51 has a stray capacitance which is approximately one half than that of the two diodes of FIG. 2.

Figure 6:
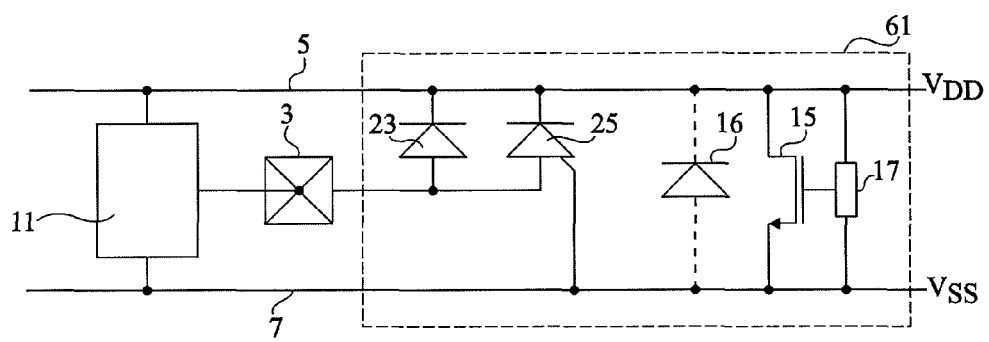
FIG. 6 shows the electric diagram of an alternative embodiment of the structure of FIG. 3.

FIG. 6 shows the electric diagram of an alternative embodiment 61 of protection structure 21 described in relation with FIG. 3. Structure 61 comprises the same components as structure 21 with an inverted biasing. In structure 61, diode 23 is forward-connected between pad 3 and positive rail 5. Further, thyristor 25 is forward-connected between positive rail 5 and pad 3, and the cathode gate (and not the anode gate) of thyristor 25 is connected to negative rail 7.

Like protections structure 21, structure 61 enables removing all types of overvoltages likely to occur between pads and/or rails of the circuit after an electrostatic discharge.

Figure 7:
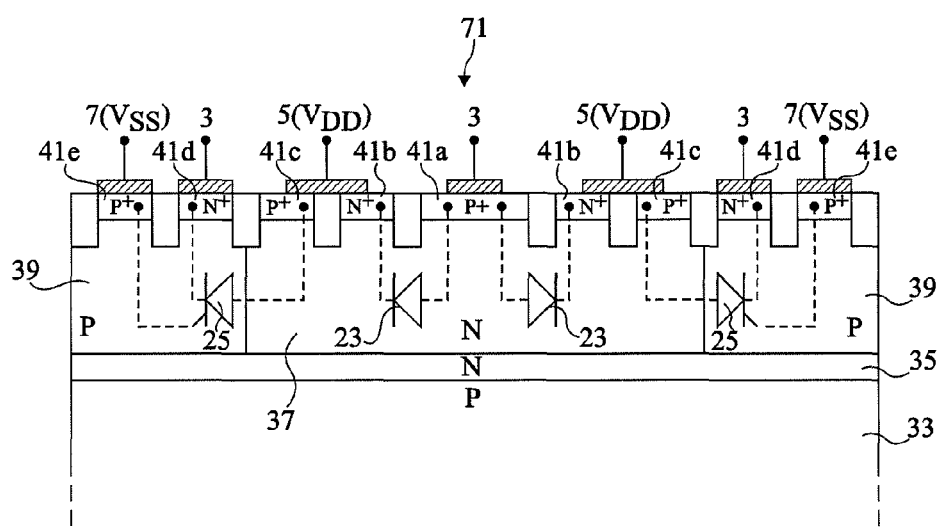
FIG. 7 is a cross-section view in the same plane as FIG. 4A showing an embodiment of a portion of the structure described in relation with FIG. 6.

FIG. 7 is a cross-section view in the same plane as FIG. 4A, schematically showing an embodiment of a protection cell 71 comprising thyristor 25 and diode 23 of protection structure 61 described in relation with FIG. 6.

Protection cell 71 is identical to protection cell 31 described in relation with FIGS. 4A and 4B, but for the fact that the conductivity types of regions 41a to 41e and of wells 37 and 39 have been inverted. Further, the connections to positive and negative rails 5 and 7 have been permuted.

According to an advantage of embodiments of the present invention, the protection cells provided hereabove may be formed according to conventional manufacturing methods, for example, in the context of a CMOS technology, and require no additional step with respect to these methods.

Specific embodiments of the present invention have been described. Various alterations and modifications will occur to those skilled in the art. In particular, positive and negative voltages have been mentioned in the above description. It should of course be understood that "positive" designates values greater than the values designated as "negative", and conversely. Often, the negative potential will be the ground.

Further, embodiments of protection cells 31, 51, and 71 comprising heavily-doped regions having, in top view, the shape of concentric rings with square contours, have been described in relation with FIGS. 4A, 4B, 5, and 7. The present invention is not limited to this specific shape. Any other closed contour shape may be used.

Moreover, in the embodiments described hereabove, the concentric ring regions are insulated from one another by silicon oxide. Some of the shown insulating layers are optional. The insulation provided between rings 41b and 41c may for example be omitted (FIGS. 4A, 4B, 5, and 7). Other insulating modes may also be provided.

Further, values of the doping levels of the different semiconductor regions forming the protection cells have been provided. These values are provided as an example only and are not limiting. They have been given in the context of a specific CMOS technology and will be easily adapted by those skilled in the art to other technological processes.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A protection cell of an integrated circuit against electrostatic discharges, electrically connected to a pad and to first and second power supply rails of the circuit, the protection cell comprising:
a diode having an electrode connected to a region of a first conductivity type and electrically connected to the second power supply rail and having an electrode electrically connected to a region of a second conductivity type and electrically connected to the pad, and
in parallel with the diode, a thyristor having an electrode electrically connected to a region of the first conductivity type and electrically connected to the pad and having a gate electrically connected to a region of the second conductivity type and electrically connected to the first rail, the first and second conductivity types being such that, in normal operation, when the circuit is powered, the diode is non-conductive, said cell comprising first to fifth regions of alternated conductivity types having, in top view, the shape of concentric rings of increasing respective diameters, wherein:
the first to third regions are formed in a central well of the first conductivity type;
the first region is of the second conductivity type;
the fourth and fifth regions are formed in a peripheral well of the second conductivity type; and
the first and fourth regions are electrically connected to said pad, the second and third regions are electrically connected to the second power supply rail, and the fifth region is electrically connected to the first power supply rail.

2. The cell of claim 1, wherein the first and second conductivity types respectively correspond to a P-type doping and to an N-type doping and, in normal operation, the first power supply rail is more positive than the second power supply rail.

3. The cell of claim 1, wherein the first and second conductivity types respectively correspond to an N-type doping and to a P-type doping and, in normal operation, the second power supply rail is more positive than the first power supply rail.

4. The cell of claim 1, wherein said regions are insulated from one another by silicon oxide regions.

5. The cell of claim 1, wherein said rings have square or rectangular contours.

6. The cell of claim 1, wherein said first region has the shape of a filled ring.

7. The cell of claim 1, wherein said first region has the shape of a ring with a hollowed central portion.

8. Protection structure comprising the cell of claim 1, and a device for removing overvoltages between the first and second supply rails.

9. The structure of claim 8, wherein said device for removing overvoltages between the first and second power supply rails comprises a MOS transistor having first and second conduction terminals respectively connected to the first and second power supply rails and, between the power supply rails, an overvoltage detector having its output controlling the MOS transistor.

10. The structure of claim 9, wherein the overvoltage detector comprises a resistor in series with a capacitor, the connection node between the resistor and the capacitor being connected to the gate of the MOS transistor.

11. An apparatus for protecting a circuit from overvoltage and/or overcurrent, the circuit comprising an input/output terminal electrically connected to at least one component of the circuit, a first power supply rail, and a second power supply rail, the apparatus comprising:
a diode having a first terminal and a second terminal, the first terminal of the diode being electrically connected to the input/output terminal of the circuit and the second terminal of the diode being electrically connected to the first power supply rail; and
a thyristor having a gate, a first terminal, and a second terminal, the first terminal of the thyristor being electrically connected to the first power supply rail, the second terminal of the thyristor being electrically connected to the input/output terminal of the circuit, and the gate of the thyristor being electrically connected to the second power supply rail.

12. The apparatus of claim 11, wherein:
the circuit is arranged to operate with the second power supply rail supplying a more positive voltage than the first power supply rail;
the first terminal of the diode electrically connected to the input/output terminal of the circuit is a cathode of the diode electrically connected to the input/output terminal of the circuit; and
the second terminal of the diode electrically connected to the first power supply rail is an anode of the diode electrically connected to the first power supply rail.

13. The apparatus of claim 11, wherein:
the circuit is arranged to operate with the first power supply rail supplying a more positive voltage than the second power supply rail;
the first terminal of the diode electrically connected to the input/output terminal of the circuit is an anode of the diode electrically connected to the input/output terminal of the circuit; and
the second terminal of the diode electrically connected to the first power supply rail is a cathode of the diode electrically connected to the first power supply rail.

14. The apparatus of claim 11 or claim 12 or claim 13, wherein:
the first terminal of the thyristor electrically connected to the first power supply rail is a cathode of the thyristor electrically connected to the first power supply rail; and
the second terminal of the thyristor electrically connected to the input/output terminal is an anode of the thyristor electrically connected to the input/output terminal of the circuit.

15. The apparatus of claim 11, wherein:
the diode and the thyristor are formed as a plurality of regions of semiconductor material;
the plurality of regions of semiconductor material comprise:
a first region of a first conductivity type formed in a second region of a second conductivity type;
a third region of the second conductivity type formed in the second region;
a fourth region of the first conductivity type formed in the second region;
a fifth region of the second conductivity type formed in a sixth region of the first conductivity type; and
a seventh region of the first conductivity type formed in the sixth region,
the diode comprises the first region, the second region, and the third region; and
the thyristor comprises the second region, the fourth region, the fifth region, and the sixth region.

16. The apparatus of claim 15, wherein:
the third region is shaped as a ring surrounding the first region in a plane;
the fourth region is shaped as a ring surrounding the third region in the plane;
the fifth region is shaped as a ring surrounding the fourth region in the plane; and
the seventh region is shaped as a ring surrounding the fifth region in the plane.

17. The apparatus of claim 16, further comprising:
a plurality of concentric rings of insulator material formed in the second region and the sixth region, the plurality of concentric rings of insulator material comprising:
a first insulating region disposed between the first region and the third region and shaped as a ring surrounding the first region;
a second insulating region disposed between the third region and the fourth region and shaped as a ring surrounding the third region;
a third insulating region disposed between the fourth region and the fifth region and shaped as a ring surrounding the fourth region; and
a fourth insulating region disposed between the fifth region and the seventh region and shaped as a ring surrounding the fifth region.

18. The apparatus of claim 16, wherein the sixth region is formed as a ring surrounding the second region in a second plane.

19. The apparatus of claim 16, wherein the first region is shaped as a hollowed ring.

20. The apparatus of claim 15, further comprising:
a plurality of regions of insulator material formed in the second region and in the sixth region, the plurality of regions of insulator material comprising:
a first insulating region disposed between the first region and the third region;
a second insulating region disposed between the third region and the fourth region;
a third insulating region disposed between the fourth region and the fifth region; and
a fourth insulating region disposed between the fifth region and the seventh region.

21. The apparatus of claim 15, wherein:
the input/output terminal is electrically connected to the first region and the fifth region;
the first power supply rail is electrically connected to third and fourth regions; and
the second power supply rail is electrically connected to the seventh region.

22. The apparatus of claim 15, wherein doping concentrations of the first region, the third region, the fourth region, the fifth region, and the seventh region are higher than doping concentrations of the second region and the sixth region.

23. The apparatus of claim 15, wherein the first conductivity type is an N conductivity type and the second conductivity type is a P conductivity type.

24. The apparatus of claim 15, wherein the seventh region is arranged to operate as at least a part of the gate of the thyristor.

* * * * *